Nov. 29, 1966 F. A. BRAUN ET AL 3,287,789

METHOD OF MAKING A CAPACITOR

Filed Oct. 23, 1961

INVENTORS F. A. BRAUN
R. F. TRAMBARULO

BY Edward M. Fink

ATTORNEY

United States Patent Office 3,287,789
Patented Nov. 29, 1966

3,287,789

METHOD OF MAKING A CAPACITOR

Frank A. Braun, Lincroft, and Ralph F. Trambarulo, Red Bank, N.J., assignors to Bell Telephone Laboratories, Incorporated, New York, N.Y., a corporation of New York Filed Oct. 23, 1961, Ser. No. 146,768
2 Claims. (Cl. 29—25.42)

This invention relates to novel aluminum capacitors and to methods for their preparation.

More particularly, the present invention is directed to novel aluminum capacitors which are of particular interest for use in biasing Esaki diodes in microwave circuits.

Recently there has been a birth of interest in a class of devices based on internal emission. These devices, operating on the tunnel principle, include the backward diode and most lately the Esaki or tunnel diode which is a single p-n junction diode that exhibits a negative resistance region when forward biased and is highly conducting when reverse biased. The backward diode evidences a normal forward characteristic and a more highly conducting reverse characteristic. The characterizing conduction region in this class of devices is produced by quantum mechanical tunneling of electrons through p-n junctions and since the tunneling effect does not depend upon minority carrier lifetime the diode may be composed of low lifetime semiconductors and is unusually tolerant to nuclear radiation, so giving rise to interest for military applications.

The tunnel diode, hereinafter termed Esaki diode, when utilized in microwave circuits requires the use of a bypass capacitor having a capacitance of the order of 1000 micromicrofarads, in order to permit stabilization of the Esaki diode and minimize power dissipation. Heretofore, high impedance capacitors have not been completely satisfactory for such purposes, resulting in undue dissipation.

In accordance with this invention a method is disclosed for the fabrication of novel aluminum capacitors having capacitances of the order of 1000 micromicrofarads and higher, such capacitors being particularly suited for use in microwave systems.

The objects of the invention will be more fully understood from the description of the invention, which will be made with reference to the accompanying drawing forming a part of the specification and wherein.

Figure 1A:
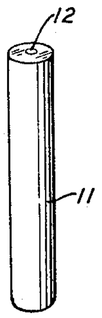
FIGS. 1A–1C are perspective views of an aluminum capacitor fabricated in accordance with this invention showing successive stages of manufacture.

With further reference now to the drawing, FIG. 1A shows an aluminum rod 11, approximately .0944 inch in diameter and approximately 9 inches in length. As a preliminary step, it is desirable to rid the surface of the rod of all traces of undesirable impurities. To this end, the aluminum rod is advantageously rinsed in trichloroethylene, dried in air and quick dipped in a 5–10 percent sodium hydroxide solution heated to a temperature of the order of 90° C. After rinsing, the aluminum rod is dipped rapidly into an aluminum bright dip comprising 80 percent by volume phosphoric acid, 5 percent by volume nitric acid, 5 percent by volume acetic acid and 10 percent by volume water, said dip being maintained at a temperature within the range of 90 to 100° C.

Following the right dip the aluminum rod is rinsed again in trichloroethylene and electrical and mechanical contact is made to any convenient point on the aluminum rod, such as 12. In order to prevent the electrical contact from becoming insulated as the aluminum is anodized, it is advantageous to coat the joint with beeswax or other suitable masking material. It is also desirable to mask that part of the connecting wire or rod immersed in the electrolyte during anodization in order to avoid possible contamination of the electrolyte and to allow the current to be monitored.

Anodization is effected in an aqueous solution of 8 percent by volume sulfuric acid wherein the aluminum rod is connected to the positive electrode of a direct current power supply. A lead sheet immersed in the solution serves as the cathode. The direct current power supply which is employed typically has a voltage range up to 30 volts and must be capable of delivering up to 100 milliamperes per square inch of aluminum rod. Initially, the aluminum rod is inserted into the electrolyte and a potential of 5 volts applied in order to prevent an initial current surge and to minimize the tendency of the aluminum to dissolve. The voltage is then increased in gradual increments until a current within the range of 20 to 100 milliamperes per square inch of aluminum is obtained. Anodization is continued for a time period of the order of 30 to 40 minutes.

Subsequent to anodization, the aluminum rod 11 is thoroughly rinsed and sealed by boiling in distilled water for a time period within the range of 15 to 30 minutes. The sealing process converts the aluminum oxide coating ($Al_2O_3$) to the monohydrate $Al_2O_3 \cdot H_2O$ and eliminates absorption on the oxide layer.

Figure 1B:
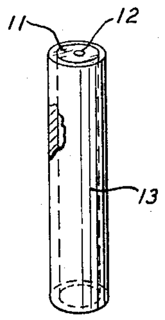

Next, the anodized rod is inserted into a clean section of copper tubing 13, typically 0.125 inch O.D. by 0.100 inch I.D. and the assembly drawn through a die, thereby reducing its outer diameter and tightly binding the copper and aluminum. The resultant capacitor shown in FIG. 1B is removed from the drawing apparatus and a suitable length cut for the desired purposes.

Figure 1C:
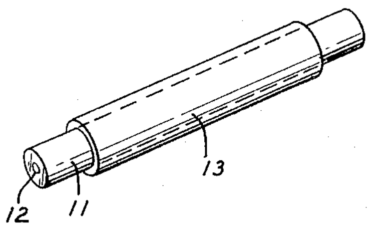

In FIG. 1C there is shown anodized aluminum rod 11 with copper sheath 13 trimmed back, thereby exposing the surface of the aluminum rod. As an alternative method for making mechanical and electrical contact 12, a hole may be drilled through the aluminum rod and reamed, so providing a snug fit for a pin upon which a crystal or point is to be mounted.

The last step in fabricating the capacitor comprises polishing the ends so that there are no burrs shorting across the anodized layer.

It will be appreciated by those skilled in the art that any conventional anodization procedure may be employed in fabricating the novel devices described herein. It will further be appreciated that the present invention is not limited to capacitors having an outer sheath of copper, any metal which is ductile and can be cold drawn being suitable for such purposes.

As illustrative of the properties of capacitors of varying lengths fabricated in accordance with the present invention, reference is made to the table. Each of the capacitors represented by the numerals 1–3 were obtained by the anodization of an aluminum rod, .0944 inch in diameter and approximately 9 inches in length, as set forth above. Following the anodization, each rod was inserted into a copper tubing 0.125 inch in O.D. and 0.100 inch in I.D. and the assembly drawn to 0.110 inch in O.D. The insulation properties of the oxide layers were not damaged and a good mechanical bond was obtained.

TABLE

| Capacitor No. | Length, inches | Capacitance micromicro-farads | Shunt Resistance in ohms | Capacitance per linear inch in micromicro-farads | Shunt Resistance per linear inch in ohms |
|---|---|---|---|---|---|
| 1 | 0.920 | 1,120 | 16 | 1,220 | 14.7 |
| 2 | 0.960 | 1,171 | 7 | 1,222 | 6.7 |
| 3 | 4.3 | 6,414 | 1.24 | 1,490 | 5.35 |

Heretofore, bypass capacitors have not been available where the capacitance per unit area exceeded 300 micromicrofarads per square inch. In accordance with the technique described, such capacitors are now available wherein the capacitance per unit area, as shown above, is of the order of 1000 micromicrofarads per square inch and higher.

Figure 2A:
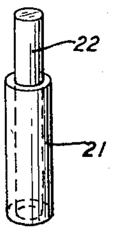
FIGS. 2A and 2B are perspective views of an aluminum capacitor wherein a center conductor is employed to facilitate electrical contact.
Figure 2B:
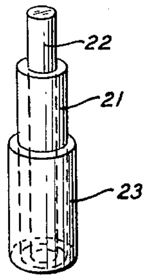

In FIGS. 2A and 2B an alternative aluminum capacitor is shown. This capacitor is prepared by drawing an aluminum sheath 21 over a silver wire 22 resulting in an apparatus as shown in FIG. 2A. The aluminum sheath is next anodized in the manner described above and a silver or copper sheath 23 drawn down over the anodized aluminum sheath, the resultant device being shown in FIG. 2B. This type of unit has the advantage of having an easily soldered center conductor to which crystals or points may be attached with ease. A further advantage to be gained by the use of this device is the smaller size, total diameters of the order of 0.060 inch being readily obtainable, so permitting its use with thin iris sections. In a typical unit it is feasible to utilize a silver wire having a diameter of approximately 0.020 inch, and an aluminum sheath having a thickness of approximately 0.020 inch, and a copper or silver sheath having a thickness of approximately 0.020 inch, so resulting in a total diameter of about 0.060 inch. Although silver has been indicated as the center conductor, it will be appreciated by those skilled in the art that any conductor will suffice for this purpose.

Figure 3:
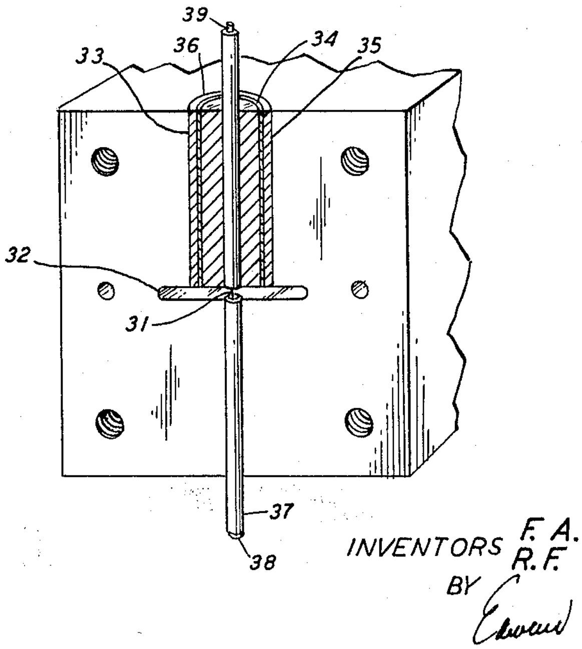
FIG. 3 is a perspective view, partly in section, of an aluminum capacitor fabricated in accordance with the present inventive technique in a microwave resonant iris.

FIG. 3 shows an aluminum capacitor prepared in accordance with the present invention in a microwave resonant iris. Esaki diode 31 is shown mounted across the center of the iris 32 which is machined of brass, 1/8 inch in thickness. The aluminum capacitor comprises aluminum rod 33, oxide layer 34 and copper sheath 35, said capacitor having been prepared as described above. The aperture 36 into which the capacitor is inserted is drilled to approximately 0.115 inch in diameter and a strong mechanical bond with high electrical resistance and capacity is obtained at the mating surfaces. A nickel center conductor 37 having crystal 38 and point 39 attached thereto, respectively, is shown disposed in contact with aluminum rod 33.

While the invention has been described in detail in the foregoing specification and the drawing similarly illustrates the same, the aforesaid is by way of illustration only and is not restrictive in character. The several modifications which will readily suggest themselves to persons skilled in the art are all considered within the scope of this invention, reference being had to the appended claims.

What is claimed is:

1. A method for the fabrication of a capacitor which comprises the steps of inserting an aluminum rod having an anodic aluminum oxide layer thereon into a sheath comprising a ductile metal and drawing the resultant assembly, thereby bringing said sheath into intimate contact with said oxide layer.

2. A method for the fabrication of a capacitor which comprises the steps of inserting an assembly including an aluminum rod disposed within a first sheath consisting essentially of aluminum, said first sheath having an anodic oxide layer of aluminum thereon, into a second sheath comprising a ductile metal and drawing the resultant assembly, thereby bringing said second sheath into intimate contact with said oxide layer.

References Cited by the Examiner

UNITED STATES PATENTS

| | | | |
|---|---|---|---|
| 1,700,454 | 1/1929 | Schumacher | 29—517 |
| 2,088,949 | 8/1937 | Fekete | 317—258 |
| 2,619,443 | 11/1952 | Robinson | 317—258 |
| 2,676,389 | 4/1954 | Corning | 29—517 |
| 2,758,267 | 8/1956 | Short | 317—242 |
| 2,930,951 | 3/1960 | Burger et al. | 317—258 |

OTHER REFERENCES

Dummer and Moderberg: "Fixed and Variable Capacitors," New York, McGraw-Hill, 1960, page 140.

LEWIS H. MYERS, *Primary Examiner.*

JOHN F. BURNS, ROBERT K. SCHAFER, *Examiners.*

E. GOLDBERG, *Assistant Examiner.*